United States Patent
Horsley et al.

(10) Patent No.: US 10,751,755 B1
(45) Date of Patent: Aug. 25, 2020

(54) PIEZOELECTRIC MICROMACHINED ULTRASONIC TRANSDUCERS HAVING DIFFERENTIAL TRANSMIT AND RECEIVE CIRCUITRY

(71) Applicant: Chirp Microsystems, Inc., Berkeley, CA (US)

(72) Inventors: David A. Horsley, Albany, CA (US); Andre Guedes, Lisbon (PT); Meng-Hsiung Kiang, Albany, CA (US); Richard Przybyla, Emeryville, CA (US); Stefon Shelton, Oakland, CA (US)

(73) Assignee: Chirp Microsystems, Inc., Berkeley, CA (US)

( * ) Notice: Subject to any disclaimer, the term of this patent is extended or adjusted under 35 U.S.C. 154(b) by 718 days.

(21) Appl. No.: 15/466,040

(22) Filed: Mar. 22, 2017

Related U.S. Application Data

(63) Continuation of application No. PCT/US2015/053606, filed on Oct. 1, 2015.
(Continued)

(51) Int. Cl.
*H01L 41/09* (2006.01)
*B06B 1/06* (2006.01)
(Continued)

(52) U.S. Cl.
CPC .......... *B06B 1/0651* (2013.01); *B06B 1/0207* (2013.01); *B06B 1/0662* (2013.01);
(Continued)

(58) Field of Classification Search
CPC ... B06B 1/0651; B06B 1/0207; B06B 1/0662; B06B 2201/55; H01L 41/09; H01L 41/113
(Continued)

(56) References Cited

U.S. PATENT DOCUMENTS 2,895,062 A * 7/1959 Abbott .................. H04R 15/00
310/334
4,276,491 A * 6/1981 Daniel ..................... A61B 8/06
310/317
(Continued)

FOREIGN PATENT DOCUMENTS

WO       2017095396        6/2017

OTHER PUBLICATIONS

International Search Report and Written Opinion for PCT/US2015/053606 dated Feb. 10, 2016.
U.S. Appl. No. 15/625,421, filed Jun. 16, 2017.

*Primary Examiner* — Thomas M Dougherty
(74) *Attorney, Agent, or Firm* — JDI Patent; Joshua D. Isenberg; Robert Pullman

(57) ABSTRACT

An apparatus comprises an ultrasonic transducer having a first and second electrode and switches which configured to selectively connect the first and second electrodes to a transmit voltage source or to a receive amplifier. The switches are configured to selectively connect a first input of the amplifier to the first electrode of the transducer and to selectively connect a second input of the amplifier to the second electrode of the transducer. The switches are also configured to selectively connect the voltage source to the first and second electrodes of the transducer. The transducer may include a piezoelectric layer attached to and sandwiched between the first electrode and the second electrode, and a flexible membrane attached to the first electrode. The piezoelectric layer may be patterned to form an annular ring at the outer diameter of the flexible membrane.

8 Claims, 4 Drawing Sheets

Related U.S. Application Data

(60) Provisional application No. 62/058,941, filed on Oct. 2, 2014.

(51) Int. Cl.
*H01L 41/113* (2006.01)
*B06B 1/02* (2006.01)

(52) U.S. Cl.
CPC ............ *H01L 41/09* (2013.01); *H01L 41/113* (2013.01); *B06B 2201/55* (2013.01)

(58) Field of Classification Search
USPC .................... 310/317–319, 320, 324, 334
See application file for complete search history.

(56) References Cited

U.S. PATENT DOCUMENTS

| | | | |
|---|---|---|---|
| 5,101,133 A | 3/1992 | Schafer | |
| 5,298,828 A | 3/1994 | Radovanovich | |
| 6,379,510 B1 * | 4/2002 | Kane | B81C 1/00142 204/192.27 |
| 6,661,285 B1 * | 12/2003 | Pompei | H03F 3/2178 310/316.03 |
| 6,673,016 B1 | 1/2004 | Bolorforosh et al. | |
| 2006/0004290 A1 * | 1/2006 | Smith | A61B 8/4483 600/459 |
| 2007/0106159 A1 * | 5/2007 | Iwama | B06B 1/023 600/459 |
| 2010/0041093 A1 | 2/2010 | Hering | |
| 2010/0150381 A1 * | 6/2010 | Lee | H04R 17/00 381/190 |
| 2010/0246332 A1 | 9/2010 | Huang | |
| 2010/0327702 A1 * | 12/2010 | Martin | B81B 3/0072 310/346 |
| 2011/0285244 A1 | 11/2011 | Lewis et al. | |
| 2017/0021391 A1 | 1/2017 | Guedes et al. | |
| 2017/0128983 A1 | 5/2017 | Horsley et al. | |
| 2017/0194934 A1 | 7/2017 | Shelton et al. | |
| 2018/0287503 A1 * | 10/2018 | Despesse | H02M 3/1582 |

* cited by examiner

PIEZOELECTRIC MICROMACHINED ULTRASONIC TRANSDUCERS HAVING DIFFERENTIAL TRANSMIT AND RECEIVE CIRCUITRY

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

FIELD OF THE DISCLOSURE

The present disclosure is related to to micromachined ultrasonic transducers (MUTs) and more particularly to the design of piezoelectric micromachined ultrasonic transducer (PMUT) devices and associated electronic circuitry used to transmit and receive ultrasound signals.

BACKGROUND

The following is a tabulation of some art that appears relevant to the present disclosure:

U.S. Pats.

| Pat. No. | Kind Code | Issue Date | Patentee |
| --- | --- | --- | --- |
| 7,579,753 | B2 | Aug. 25, 2009 | Fazzio et al. |
| 7,538,477 | B2 | May 26, 2009 | Fazzio et al. |

U.S. Pat. Application Publications

| Publication No. | Kind Code | Pub Date | Applicant |
| --- | --- | --- | --- |
| 2010/0117485 | A1 | May 13, 2010 | Martin et al. |

Piezoelectric micromachined ultrasonic transducers (PMUTs) are ultrasonic transducers used to transmit and receive ultrasound. The optimal design of a PMUT includes electrical, mechanical, and manufacturing considerations. Considering electrical design, there is a need to design an appropriate electrode structure that reduces the PMUTs sensitivity to noise arising from electromagnetic interference and allows the PMUT to generate a large acoustic output signal. Considering mechanical design, a PMUT transmits and receives ultrasound in a frequency band centered at its flexural resonance frequency. Variations in the resonance frequency due to residual stress, packaging stress, and thermal stress should be minimized. Considering manufacturing, it is desirable to minimize the number of electrical connections to the PMUT in order to reduce manufacturing cost and package size, particularly when arrays of PMUTs are to be fabricated on a common substrate.

US Patent Application 20100117485 (Martin et al.) and U.S. Pat. Nos. 7,579,753 and 7,538,477 (Fazzio et al.) disclose various electrode designs for piezoelectric transducers. The common concept behind these designs is illustrated in FIG. 1, which shows a circuit 100 consisting of two piezoelectric transducers 101 and 102 connected to a differential amplifier 101. As disclosed by Martin et al, two load resistors, $R_L$, 103 and 104 terminate the inputs of amplifier 101 to ground. Circuit 100 is intended to increase the signal to noise ratio by rejecting common mode noise signals appearing on the inputs of differential amplifier 101 by matching the impedances on the amplifier's inputs. This design is an improvement over a single-ended design wherein the electrical impedances on the two inputs of amplifier 101 are not matched. However, the prior art circuit 100 suffers from several flaws. First, if two transducers 101 and 102 are required, the cost, complexity and size are doubled. Second, the use of resistors 103 and 104 results in additional thermal noise at the input of amplifier 105, which degrades the signal-to-thermal noise ratio.

In an alternative embodiment described by Martin et al, the two piezoelectric transducers 101 and 102 are located on a single flexural membrane, as shown in top view in FIG. 2A and in cross-section view in FIG. 2B. This flexural piezoelectric transducer consists of a single piezoelectric layer 201 deposited onto a substrate 200. Electrodes 1a, 1b and 2a, 2b of piezoelectric transducers 101 and 102 are patterned into a top metal electrode layer 202 and a bottom metal electrode layer 203. While this second embodiment requires only a single flexural transducer, it suffers from a number of flaws. First, a transducer composed entirely of a piezoelectric film suffers from poor manufacturability due to residual stress variations in the piezoelectric layer. A more manufacturable design is needed that accommodates stress variations in the piezoelectric layer. Second, the transducer design shown in FIG. 2A and FIG. 2B requires four electrical connections, adding cost and complexity. A transducer design is needed that achieves good common mode noise rejection with only two electrical connections per transducer.

Finally, Martin et al. focus exclusively on the electrical performance of the transducer as a receiver (e.g. a microphone). Because a PMUT is used both to receive and transmit ultrasound, an electrode and circuit design is needed to address the performance of the PMUT as both a transmitter and a receiver.

It is within this context that aspects of the present disclosure arise.

BRIEF DESCRIPTION OF THE DRAWINGS

The invention will be more fully understood by reference to the following drawings which are for illustrative purposes only.

DETAILED DESCRIPTION

Although the description herein contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art.

This application discloses a piezoelectric micromachined ultrasonic transducer (PMUT) device and associated circuitry used to transmit and receive ultrasound signals. It will be appreciated that the following embodiments are provided by way of example only, and that numerous variations and modifications are possible. For example, while circular embodiments are shown, the PMUT may have many different shapes such as square, rectangular, hexagonal, octagonal, and so on. Furthermore, while PMUTs are shown having a unimorph construction, consisting of a single piezoelectric layer on a passive layer, bimorph and multimorph PMUTs having multiple piezoelectric layers and various electrode patterns are possible. All such variations that would be apparent to one of ordinary skill in the art are intended to fall within the scope of this disclosure. It will also be appreciated that the drawings are not necessarily to scale, with emphasis being instead on the distinguishing features of the PMUT device disclosed herein.

Figure 3:
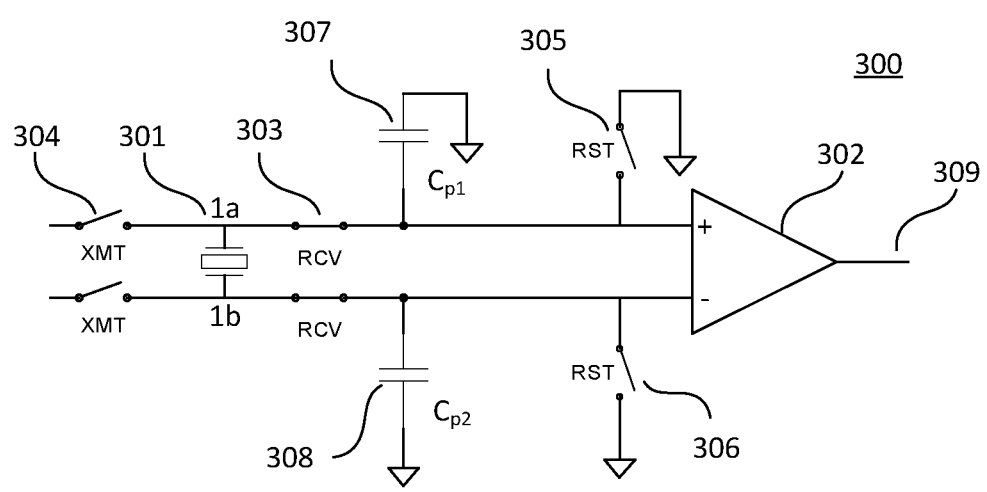
FIG. 3 shows a simplified receiving circuit diagram corresponding to an embodiment of the invention.

FIG. 3 shows a simplified diagram of the PMUT receiver circuit 300 in accordance with a representative embodiment. The circuit comprises a piezoelectric transducer 301 connected to a differential amplifier 302 through a pair of receive (RCV) switches 303. Switches 303 are closed when the transducer is used to receive ultrasound signals. Similarly, to transmit ultrasound, RCV switches 303 are opened and a pair of transmit (XMT) switches 304 are closed, connecting the transducer electrodes to a transmit amplifier (omitted for clarity). Another pair of reset (RST) switches, 305 and 306, are used to periodically reset the inputs of amplifier 302 to a common potential during a reset phase. In an operational mode where the PMUT is used to transmit and receive, the reset phase can be timed to precede the receive cycle. In an operational mode where the PMUT is only used to receive, the reset phase can be periodic with a reset phase which is much shorter in time duration than the time constant of the PMUT. Parasitic capacitances $C_{P1}$ 307 and $C_{P2}$ 308 represent the capacitance from the non-inverting (+) and inverting (−) inputs of amplifier 302 to ground. The layouts of the PMUT and integrated circuit are designed such that parasitic capacitances $C_{P1}$ 307 and $C_{P2}$ 308 are approximately equal, thereby ensuring that common-mode noise on the non-inverting and inverting terminals of amplifier 302 is substantially cancelled.

Figure 4:
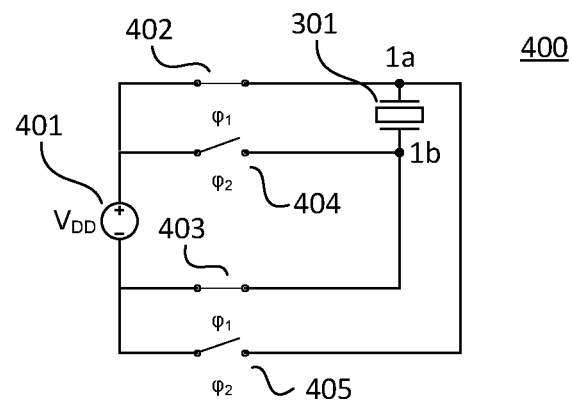
FIG. 4 shows a simplified transmitting circuit diagram corresponding to an embodiment of the invention.

FIG. 4 shows a simplified diagram of the PMUT transmitter circuit 400 in accordance with a representative embodiment. For clarity, the receiving circuitry is omitted from this figure. The circuit comprises a piezoelectric transducer 301, a voltage source $V_{DD}$ 401, and several switches. The voltage source may be a unipolar voltage source. By way of example, and not by way of limitation, voltage source 401 may be a charge pump that converts a low voltage power supply to a higher voltage to increase the amplitude of the transmit signal. In such an implementation, the charge pump may be a unipolar charge pump. The switches allow the voltage polarity across piezoelectric transducer 301 to be alternated from positive to negative in order to double the voltage swing across the piezoelectric transducer, thereby doubling the transmitted ultrasound pressure. Positive polarity is applied by closing switches 402 and 403, connecting the positive terminal of source 401 to electrode 1a of piezoelectric transducer 301 and the negative terminal to electrode 1b. Negative polarity is applied by closing switches 404 and 405, connecting the negative terminal of source 401 to electrode 1a of piezoelectric transducer 301 and the positive terminal to electrode 1b.

Figure 5A:
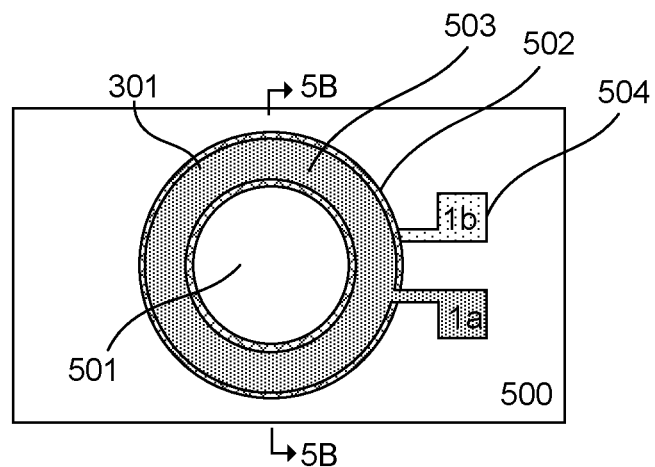
FIG. 5A shows a top view of a piezoelectric transducer design corresponding to a representative embodiment.
Figure 5B:
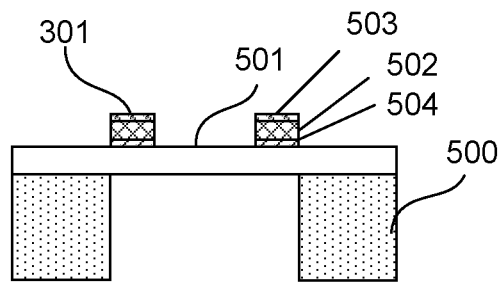
FIG. 5B shows a cross-section view of a piezoelectric transducer design corresponding to a representative embodiment.

FIG. 5A shows a top view and FIG. 5B shows a cross-section view of a PMUT in accordance with an embodiment. The PMUT is composed of a flexible membrane 501 that is supported by a substrate 500. Acoustic signals are transmitted and received using a ring-shaped piezoelectric transducer 301 surrounding the perimeter of membrane 501. Ring-shaped transducer 301 is composed of a piezoelectric layer 502 and top electrode 503 and bottom electrode 504. The top electrode and bottom electrode are designed to be substantially the same size so that the parasitic capacitance to ground is nearly identical at top electrode contact 1a and bottom electrode contact 1b. For example, the first and second electrodes may be designed such that electrical impedances between each of the first and second electrodes and the transducer substrate 500 are substantially identical.

Figure 1:
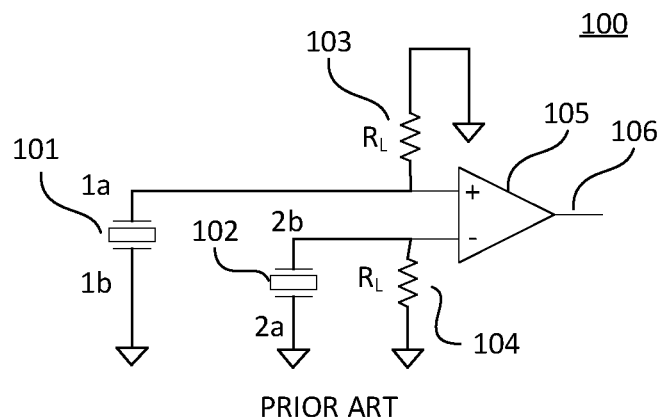
FIG. 1 shows a simplified equivalent circuit diagram of a transducer design known from prior art.
Figure 2A:
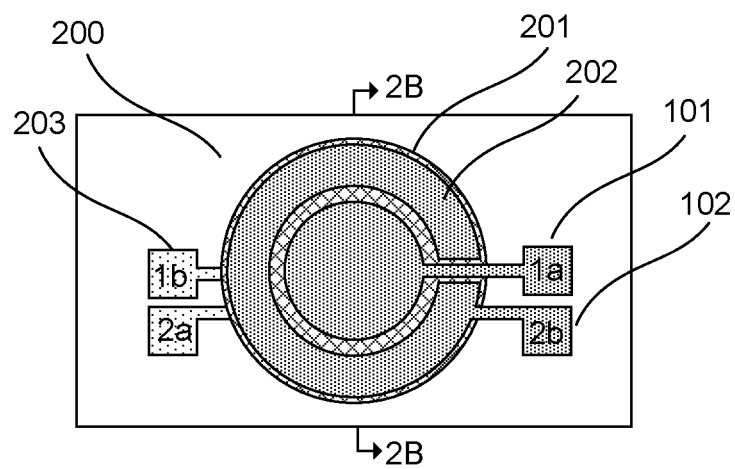
FIG. 2A shows a top view of a piezoelectric transducer design known from prior art.
Figure 2B:
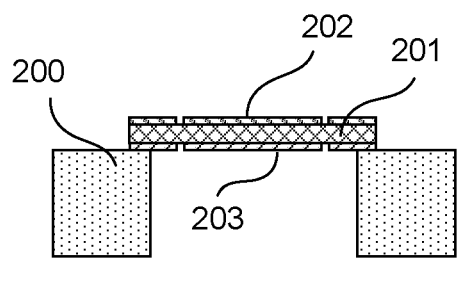
FIG. 2B shows a cross-section view of a piezoelectric transducer design known from prior art.

PMUTs are resonant devices wherein ultrasound is transmitted and received in a frequency band centered at the PMUTs flexural resonance frequency. For manufacturability, it is desirable for a PMUT design to have a resonant frequency that is insensitive to fabrication variations, such as residual stress. In prior art, such as the transducer design shown in FIG. 2A and FIG. 2B, variations in the residual stress of the piezoelectric layer 201 and metal layers 202 and 203 create large changes in the resonant frequency of the PMUT. The embodiment shown in FIG. 5A and FIG. 5B, the piezoelectric layer 502 and metal layers 503 and 504 are removed from the majority of the surface of flexible membrane 501, the resonant frequency of the PMUT is determined primarily by the geometry (diameter, thickness) and material properties (Young's modulus, Poisson's ratio, residual stress) of the flexible membrane 501.

Figure 6:
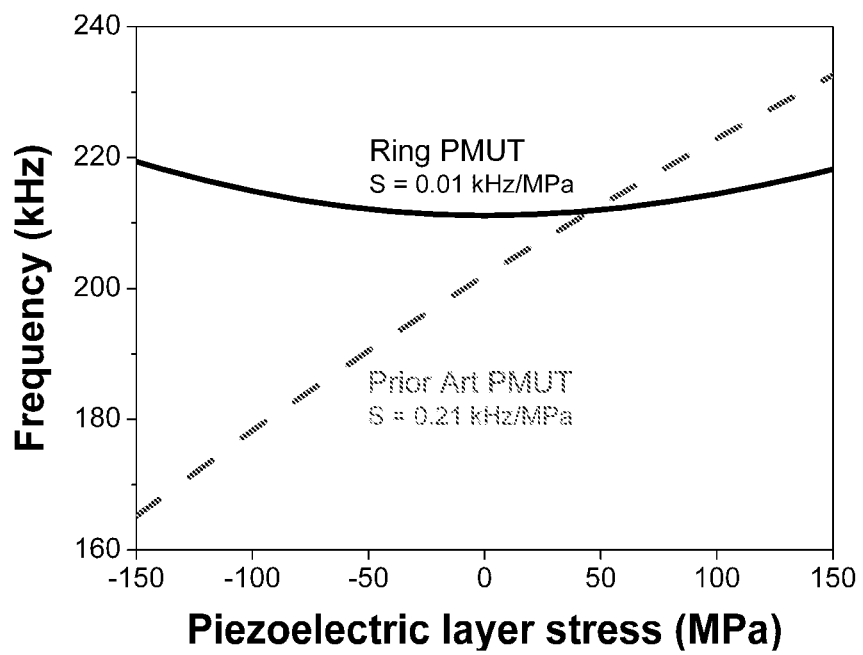
FIG. 6 shows the simulated resonant frequency of a representative embodiment compared to a prior-art piezoelectric transducer.

FIG. 6 shows the results of a finite element method (FEM) simulation of the resonant frequency of a PMUT using the new ring transducer design presented here compared to the resonant frequency of a prior art PMUT where the piezoelectric layer extends over the entire surface of the flexible membrane. The resonant frequency of the ring transducer design is >20× less sensitive to stress variations in the piezoelectric layer than the prior art design. For a similar layer stack, and for a stress condition that is nominally near zero, the new ring transducer design has a stress sensitivity S=0.01 kHz/MPa, while the prior art PMUT has S=0.21 kHz/MPa.

The preferred new ring PMUT also shows better operational frequency bandwidth, when compared with the prior art PMUT. The bandwidth $\Delta\omega_0$ is a function of the membrane damping b and mass m: $\Delta\omega_0 \partial b/m$. The damping b is the same for both designs, since it is a function of the membrane area. However the mass m is lower for the new ring pMUT, since the piezoelectric material is removed in the center of the membrane. The ring PMUT will then have higher bandwidth, inversely proportional to its reduced mass.

All cited references are incorporated herein by reference in their entirety. In addition to any other claims, the applicant(s)/inventor(s) claim each and every embodiment of the invention described herein, as well as any aspect, component, or element of any embodiment described herein, and any combination of aspects, components or elements of any embodiment described herein.

The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112, ¶6. In particular, the use of "step of" in the claims herein is not intended to invoke the provisions of 35 USC § 112, ¶6.

The invention claimed is:

1. An apparatus comprising:
   a piezoelectric micromachined ultrasonic transducer having a first and second electrode;
   a unipolar charge pump; and
   a first set of one or more switches configured to selectively connect the first and second electrodes to unipolar charge pump and a second set of switches configured to selectively couple the first and second electrodes to a receive amplifier; and
   wherein the first set of one or more switches is configured to selectively connect a first input of the receive amplifier to the first electrode of the ultrasonic transducer and to selectively connect a second input of the receive amplifier to the second electrode of the ultrasonic transducer; and
   wherein the second set of one or more switches is configured to selectively connect the unipolar charge pump to the first and second electrodes of the ultrasonic transducer.

2. The apparatus of claim 1, wherein the switches are configured to produce a bipolar transmit signal from the unipolar charge pump by sequentially reversing the connections between the voltage source terminals and the first and second electrodes of the ultrasonic transducer.

3. The apparatus of claim 1, wherein the second set of switches is configured to produce a bipolar transmit signal from the unipolar charge pump by sequentially reversing the connections between the voltage source terminals and the first and second electrodes of the ultrasonic transducer, wherein in a first state the first electrode is connected to a positive terminal of the unipolar charge pump and the second electrode is connected to a negative terminal of the unipolar charge pump and wherein in a second state the first electrode is connected to a negative terminal of the unipolar charge pump and the second electrode is connected to a positive terminal of the unipolar charge pump.

4. The apparatus of claim 1, further comprising the receive amplifier.

5. The apparatus of claim 4, wherein the receive amplifier is a differential receive amplifier.

6. The apparatus of claim 1, wherein the ultrasonic transducer includes a piezoelectric layer attached to and sandwiched between the first electrode and the second electrode, and a flexible membrane attached to the first electrode.

7. The apparatus of claim 6, wherein the piezoelectric layer is patterned to form an annular ring at the outer diameter of the flexible membrane.

8. The apparatus of claim 7, wherein the first and second electrodes are designed such that an electrical impedance between each of the first and second electrodes and a transducer substrate are substantially identical.

* * * * *